United States Patent [19]
Saito et al.

[11] Patent Number: 6,007,672
[45] Date of Patent: *Dec. 28, 1999

[54] ELECTRODE FOR PLASMA ETCHING

[75] Inventors: Kazuo Saito; Yasushi Mochizuki; Akira Yamaguchi, all of Tokyo, Japan

[73] Assignee: Nisshinbo Industries, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/839,366

[22] Filed: Apr. 18, 1997

[30] Foreign Application Priority Data

Apr. 22, 1996 [JP] Japan ................................. 8-124073

[51] Int. Cl.$^6$ ....................................................... C23F 1/02
[52] U.S. Cl. ................. 156/345; 204/298.31; 118/723 E
[58] Field of Search ...................... 204/298.31; 156/345; 118/723 E

[56] References Cited

U.S. PATENT DOCUMENTS

| | | | |
|---|---|---|---|
| 5,004,322 | 4/1991 | Verhulst et al. | 350/320 |
| 5,252,196 | 10/1993 | Sonnenberg et al. | 205/296 |
| 5,681,195 | 10/1997 | Egami et al. | 445/24 |
| 5,853,523 | 12/1998 | Machida et al. | 156/345 |

FOREIGN PATENT DOCUMENTS

0421686 A2  4/1991  European Pat. Off. .

OTHER PUBLICATIONS

Patent Abstracts of Japan, Publication No. 61206225 (Sep. 12, 1986).

*Primary Examiner*—Kishor Mayekar
*Attorney, Agent, or Firm*—Birch, Stewart, Kolasch & Birch, LLP

[57] ABSTRACT

Disclosed is an electrode for parallel plate type plasma etching, which is capable of suppressing the generation of dust. The electrode has a flatness in a range of from 0.001 to 5 mm and has a (positive) camber that the front surface side of the electrode is recessed and the back surface side thereof projects.

9 Claims, 2 Drawing Sheets

ELECTRODE FOR PLASMA ETCHING

BACKGROUND OF THE INVENTION

The present invention relates to an electrode for parallel plate electrode type plasma etching used for production of semiconductor integrated circuits, such as LSIs or ICs, or waveguides for optical communication.

In recent years, a parallel plate electrode type plasma etching technique capable of forming a finer pattern on a wafer at a high accuracy has come to be increasingly important along with the advance of techniques for producing semiconductor integrated circuits with finer-geometries and higher densities.

In such a parallel plate type plasma etching process, there have been used electrodes formed of aluminum, graphite, glassy carbon, metal silicon, quartz, and the like. Each of these electrodes presents a problem that the electrode is eroded and consumed by plasma during etching and particles (dust) are scattered from the electrode and adhere on the surface of a wafer.

SUMMARY OF THE INVENTION

An object of the present invention is to provide an electrode for parallel plate type plasma etching, which is capable of significantly reducing the generation of dust.

The present inventor has earnestly studied to achieve the above object, and found that an electrode for parallel plate type plasma etching, which is capable of suppressing the generation of particles during etching and enabling high precise plasma etching a high yield, can be obtained by specifying a flatness (defined in JIS-B0021) of the electrode to be in a range of from 0.001 to 5 mm, and preferably, specifying a camber of the electrode such that the front surface side of the electrode is recessed and the back surface side thereof projects.

More detailedly, the present inventor has examined how particles (dust) are generated from an etching electrode, and s found that other than a known mechanism that particles are generated from the electrode when the electrode is bombarded with plasma, there is another mechanism that when a gap is formed between a member (called a baffle plate) provided on the back surface of an etching electrode and the etching electrode, an abnormal discharge is possibly generated in the gap, so that dust particles are generated by the abnormal discharge. As a result of the further examination to prevent the generation of dust, it was found that the generation of dust can be prevented by specifying a flatness (defined in JIS-B0021) of the electrode to be in a range of from 0.001 to 5 mm, and preferably, specifying a camber direction of the electrode such that the front surface side of the electrode is recessed and the back surface side thereof projects, whereby closely mounting the plasma etching electrode on the baffle plate without any gap. On the basis of the above knowledge, the present invention has been accomplished.

Therefore, according to the present invention, there is provided an electrode for parallel plate electrode type plasma etching, which has a flatness in a range of from 0.001 to 5 mm, and preferably, which has such a camber that the front surface side of the electrode is recessed and the back surface side thereof projects. Additionally, the above electrode is preferably configured that at least a portion of the electrode to be consumed by plasma is formed of a glassy carbon material or metal silicon.

BRIEF DESCRIPTION OF THE DRAWINGS

The present invention disclosed herein will be understood better with reference to the following drawing of which:

FIGS. 1(A) and 1(B) show a state in which an electrode is cambered in a positive direction, wherein FIG. 1(A) is a sectional view showing the state before the electrode is mounted on a baffle plate, and FIG. 1(B) is a sectional view showing the state after the electrode is mounted on the baffle plate; and FIGS. 2(A) and 2(B) show a state in which an electrode is cambered in a negative direction, wherein FIG. 1(A) shows the state before an electrode is mounted on a baffle plate, and FIG. 2(B) is a sectional view showing the state after the electrode is mounted on the baffle plate.

DETAILED DESCRIPTION OF THE PREFERRED EMBODIMENTS

The preferred embodiments of the present invention will be described with reference to the accompanying drawings.

An electrode for parallel flat type plasma etching according to the present invention has a flatness (defined in JIS B0021), that is, the cambered amount in a range of from 0.001 to 5 mm, preferably, in a range of from 0.001 to 2 mm. When the flatness is more than 5 mm, it is difficult to mount the electrode on a baffle plate without cracking of the electrode.

Figure 1A:
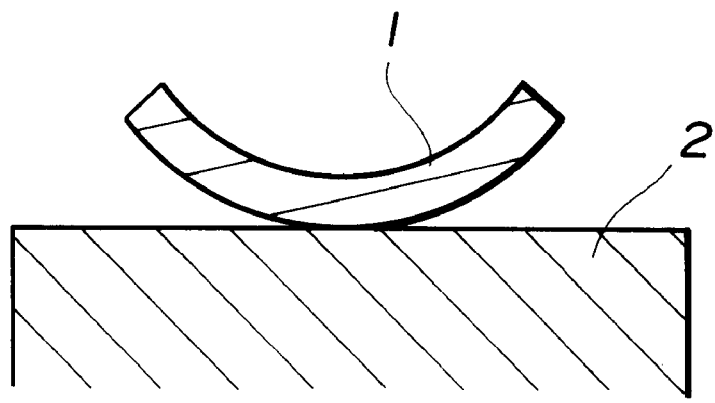
Figure 1B:
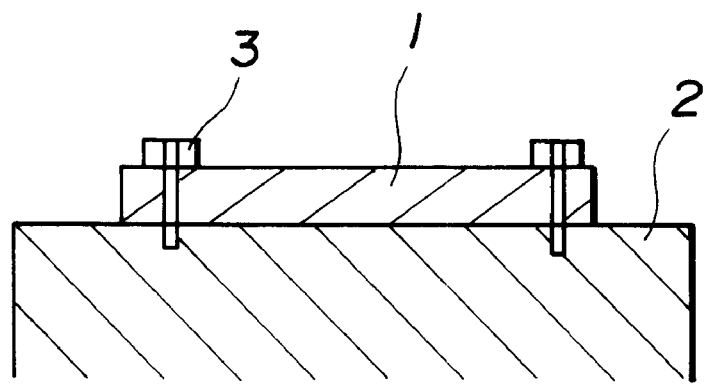
Figure 2A:
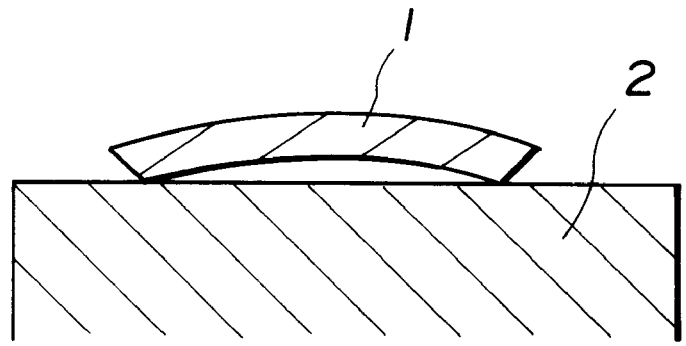
Figure 2B:
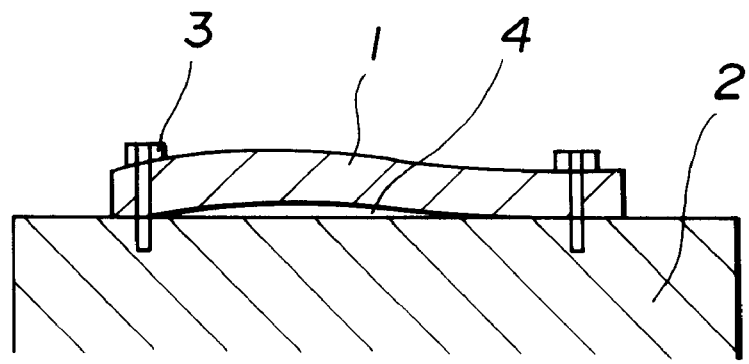

Further, the electrode preferably has such a camber that the front surface side of the electrode is recessed and the back surface side thereof projects. Specifically, as shown in FIGS. 1(A), 1(B) and FIGS. 2(A), 2(B), in the case where an electrode 1 is mounted on a baffle plate 2, assuming that the camber direction where the projecting surface of the electrode 1 is brought in press-contact with the baffle plate provided on the back surface side is specified as a positive direction and that a camber direction where the recessed surface of the electrode is brought in press-contact with the baffle plate 2 is specified as a negative direction, it is desired that the electrode 1 is cambered in the positive direction. In the case where the electrode 1 is cambered in the negative direction, when the electrode 1 is mounted on the baffle plate by bolts 3 or the like, a gap 4 is generated between the electrode 1 and the baffle plate 2 as shown in FIG. 2(B). In this state, abnormal discharge is liable to be generated as described above. On the contrary, in the case where the electrode 1 is cambered in the positive direction, it is mounted without such a gap, to thereby prevent the generation of the abnormal discharge due to the gap.

The electrode may be formed of a known material, but to achieve the object of the present invention, it is preferably formed of metal silicon or a glassy carbon material. The glassy carbon material may be produced from a source material selected from cellulose, furfuryl alcohol, phenol resin, acetone, polycarbodiimide resin, furan resin, furfural resin, other thermosetting resins, and mixtures thereof. Metal silicon may be of either a single crystal type or a polycrystalline type.

In this case, the entire electrode may be formed of metal silicon or a glassy carbon material. Preferably, in terms of the material cost, at least a portion to be consumed by plasma may be formed of metal silicon or a glassy carbon material. In the latter case, a portion other than the portion formed of metal silicon or a glassy carbon material can be formed of aluminum or graphite, although in terms of the material cost, it is preferably formed of a carbon material covered with a glassy carbon material.

With respect to the electrode of the present invention, the surface, particularly, the surface to be in contact with plasma can be polished by, while not restrictively, lapping using abrasives, buffing, or electrolytic polishing.

The plasma etching electrode of the present invention can be formed with a suitable number of through-holes for allowing a reaction gas to smoothly flow in a plasma region therethrough. Such a through-hole can be formed by ultrasonic machining, electric discharge machining, drilling, laser machining, or water jet machining.

The plasma etching electrode of the present invention is most suitable for parallel flat type plasma etching, but it can be used for a general plasma etching process; and the plasma etching using such an electrode can be performed under normal conditions.

The present invention will be more clearly understood with reference to the following examples, but it is to be noted that such examples are for illustrative purposes only and are not intended to limit the present invention.

EXAMPLES

An electrode sample having a flatness and a camber direction shown in Table 1 was prepared by slicing a single crystal silicon member doped with P-type boron into a thickness of 4 mm, forming holes (diameter: 0.8 mm, pitch: 3.175 mm) in the surface of the member by drilling, and polishing the surface of the member using a lapping machine.

An electrode sample having a flatness and a camber direction shown in Table 1 was also prepared by drilling and surface-finishing a glassy carbon plate (concentration of impurity: 2 ppm, thickness: 4 mm) in the same manner as described above.

Each of the above electrode samples was mounted on a baffle plate and set into a plasma etching system, and an oxide film on a silicon wafer (diameter: 6 inch) was etched by plasma using a mixed gas of trifluoromethane as a reaction gas, argon and oxygen. After this etching, the number of particles (particle size: 0.3 $\mu$m or more) adhering on the surface of the wafer was counted. The results are shown in Table 1.

From the results shown in Table 1, it is revealed that a plasma etching electrode according to the present invention can significantly reduce the number of particles at the etching step and enables high precise etching at a high yield.

TABLE 1

|  |  | material | camber direction | flatness | number of particles |
|---|---|---|---|---|---|
| Example | 1 | silicon | + | 0.001 | 1 |
|  | 2 | silicon | + | 0.05 | 1 |
|  | 3 | silicon | + | 0.1 | 1 |
|  | 4 | silicon | + | 0.5 | 2 |
|  | 5 | silicon | + | 1.9 | 2 |
|  | 6 | glassy carbon | + | 0.001 | 3 |
|  | 7 | glassy carbon | + | 0.05 | 4 |
|  | 8 | glassy carbon | + | 0.12 | 3 |
|  | 9 | glassy carbon | + | 0.6 | 4 |
|  | 10 | glassy carbon | + | 1.9 | 5 |
| Comparative | 1 | silicon | − | 0.1 | 30 |
| Example | 2 | silicon | − | 1 | 80 |
|  | 3 | silicon | + | 5 | *1) |
|  | 4 | glassy carbon | − | 0.1 | 28 |
|  | 5 | glassy carbon | − | 1.3 | 100 |
|  | 6 | glassy carbon | + | 5 | *2) |

*1,2) cracking of electrode upon mounting on baffle plate

We claim:

1. A method of forming a fine pattern on a wafer through parallel plate electrode plasma etching, the method comprising the step of:
plasma etching said wafer with a parallel plate electrode; wherein said electrode possesses a front surface side, a back surface side and a flatness in a range of from 0.001 to 5 mm, to reduce the generation of dust on the wafer during said plasma etching.

2. The method of claim 1 wherein said electrode has a camber such that the front surface side of said electrode is recessed and the back surface side thereof projects.

3. The method of claim 1 or 2 wherein at least a portion of said electrode is formed of either a glassy carbon material or silicon, wherein said silicon is doped.

4. An electrode for parallel plate plasma etching, which has a front surface side, a back surface side and a flatness in a range from 0.001 to 5 mm, wherein said electrode has a camber such that the front surface side of said electrode is recessed and the back surface side thereof projects, to reduce the generation of dust on a wafer during said plasma etching; wherein the electrode is formed of a material consisting essentially of aluminum, graphite, glassy carbon, doped silicon, carbon material, and mixtures thereof; and wherein the electrode has through-holes for allowing a reaction gas to flow in a plasma region therethrough.

5. The electrode for parallel plate plasma etching as recited in claim 4, wherein said electrode is formed of a material consisting essentially of glassy carbon material or doped silicon.

6. A mounted electrode for parallel plate plasma etching, which electrode is mounted on a baffle plate, wherein said electrode has a flatness in a range of from 0.001 to 5 mm, to reduce the generation of dust on a wafer during said plasma etching; wherein the electrode is formed of a material consisting essentially of aluminum, graphite, glassy carbon, doped silicon, carbon material, and mixtures thereof; and wherein the electrode has through-holes for allowing a reaction gas to flow in a plasma region therethrough.

7. The mounted electrode for parallel plate plasma etching as recited in claim 6, wherein said electrode has a front surface side, a back surface side and a flatness in a range of from 0.001 to 5 mm; and said electrode has a camber such that the front surface side of said electrode is recessed and the back surface side thereof projects, to reduce the generation of dust on a wafer during said plasma etching.

8. The mounted electrode for parallel plate plasma etching as recited in claim 6, wherein said electrode has a front surface side, a back surface side and a flatness in a range of from 0.001 to 5 mm; and said electrode has a camber such that the front surface side of said electrode is recessed and the back surface side thereof projects, to reduce the generation of dust on a wafer during said plasma etching, and wherein said electrode is formed of a glassy carbon material or doped silicon.

9. A mounted electrode for parallel plate plasma etching, wherein
said electrode has a front surface side and a back surface side and the electrode is mounted on a baffle plate such that the back surface side of the electrode is in contact with the baffle plate,
said electrode has a flatness in a range of from 0.001 to 5 mm to reduce the generation of dust on a wafer during said plasma etching;
wherein the electrode has through-holes for allowing a reaction gas to flow in a plasma region therethrough.

* * * * *